(12) United States Patent
Besinga et al.

(10) Patent No.: US 12,119,068 B2
(45) Date of Patent: Oct. 15, 2024

(54) PROGRAM CONTINUATION STRATEGIES AFTER MEMORY DEVICE POWER LOSS

(71) Applicant: Micron Technology, Inc., Boise, ID (US)

(72) Inventors: Gary F. Besinga, Boise, ID (US); Vamsi Pavan Rayaprolu, San Jose, CA (US); Steven Michael Kientz, Westminster, CO (US); Renato C. Padilla, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 392 days.

(21) Appl. No.: 17/675,241

(22) Filed: Feb. 18, 2022

(65) Prior Publication Data

US 2023/0268014 A1    Aug. 24, 2023

(51) Int. Cl.
*G11C 16/34* (2006.01)
*G11C 16/10* (2006.01)
*G11C 16/26* (2006.01)

(52) U.S. Cl.
CPC ........ *G11C 16/3459* (2013.01); *G11C 16/102* (2013.01); *G11C 16/26* (2013.01); *G11C 16/3404* (2013.01)

(58) Field of Classification Search
CPC ... G11C 16/3404; G11C 16/26; G11C 16/102; G11C 16/3459
USPC ..................................................... 365/185.22
See application file for complete search history.

(56) References Cited

U.S. PATENT DOCUMENTS

| | | | |
|---|---|---|---|
| 9,361,991 B1 * | 6/2016 | Ng | G11C 16/08 |
| 9,691,485 B1 * | 6/2017 | Kumar | G06F 3/0653 |
| 2016/0283397 A1 * | 9/2016 | Lehman | G06F 12/0246 |
| 2022/0365682 A1 * | 11/2022 | Lee | G06F 3/0652 |

\* cited by examiner

*Primary Examiner* — Sung Il Cho
(74) *Attorney, Agent, or Firm* — LOWENSTEIN SANDLER LLP

(57) ABSTRACT

A system includes a memory device and a processing device, operatively coupled with the memory device, to perform operations including detecting a power up event of the memory device, responsive to detecting the power up event, selecting an open block of the memory device, wherein the open block comprises a set of pages, determining, based at least in part on an analysis of the set of pages, whether the open block is valid for programming, and responsive to determining that the open block is valid for programming, keeping the open block open for programming.

20 Claims, 4 Drawing Sheets

PROGRAM CONTINUATION STRATEGIES AFTER MEMORY DEVICE POWER LOSS

TECHNICAL FIELD

Embodiments of the disclosure relate generally to memory sub-systems, and more specifically, relate to program continuation strategies after memory device power loss.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
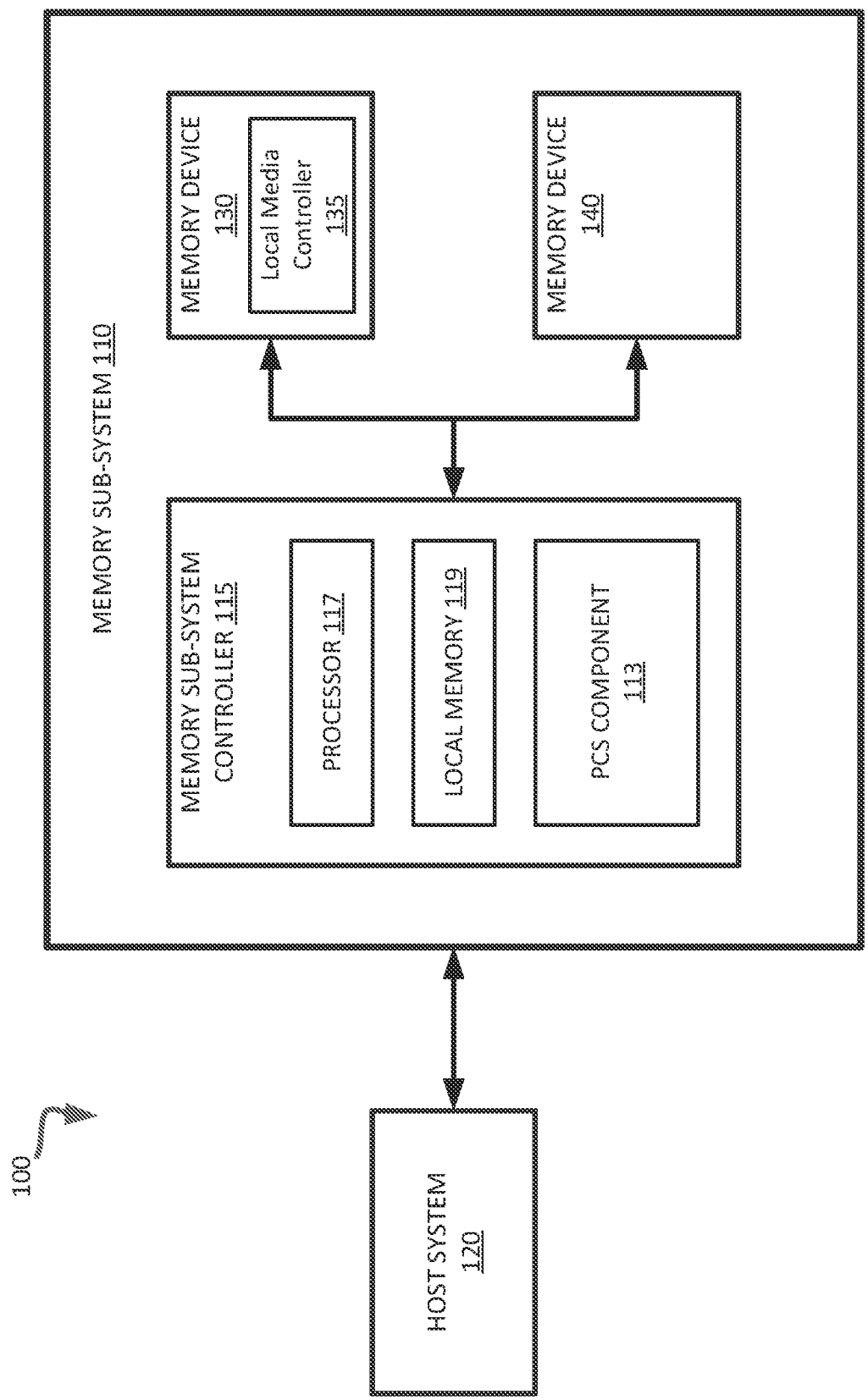
FIG. 1 illustrates an example computing system that includes a memory sub-system, in accordance with some embodiments of the present disclosure.

Aspects of the present disclosure are directed to program continuation strategies after memory device power loss. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include multiple bits arranged in a two-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

A memory cell can be programmed (written to) by applying a certain voltage to the memory cell, which results in an electric charge being held by the memory cell. For example, a voltage signal $V_{CG}$ that can be applied to a control electrode of the cell to open the cell to the flow of electric current across the cell, between a source electrode and a drain electrode. More specifically, for each individual memory cell (having a charge Q stored thereon) there can be a threshold control gate voltage $V_T$ (herein also referred to as the "threshold voltage" or simply as "threshold") such that the source-drain electric current is low for the control gate voltage ($V_{CG}$) being below the threshold voltage, $V_{CG} < V_T$. The current increases substantially once the control gate voltage has exceeded the threshold voltage, $V_{CG} > V_T$. Because the actual geometry of the electrodes and gates varies from cell to cell, the threshold voltages can be different even for cells implemented on the same die. The memory cells can, therefore, be characterized by a distribution P of the threshold voltages, $P(Q,V_T) = dW/dV_T$, where dW represents the probability that any given cell has its threshold voltage within the interval $[V_T, V_T + dV_T]$ when charge Q is placed on the cell.

A memory device can have distributions $P(Q,V_T)$ that are narrow compared with the working range of control voltages tolerated by the cells of the device. Accordingly, multiple non-overlapping distributions $P(Q_k,V_T)$ ("valleys") can be fit into the working range allowing for storage and reliable detection of multiple values of the charge $Q_k$, k=1, 2, 3 . . . The distributions (valleys) are interspersed with voltage intervals ("valley margins") where none (or very few) of the memory cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. This effectively allows a single memory cell to store multiple bits of information: a memory cell operated with 2N−1 well-defined valley margins and 2N valleys is capable of reliably storing N bits of information. Specifically, the read operation can be performed by comparing the measured threshold voltage $V_T$ exhibited by the memory cell to one or more reference voltage levels corresponding to known valley margins (e.g., centers of the margins) of the memory device.

One type of memory cell ("cell") is a single level cell (SLC), which stores 1 bit per cell and defines 2 logical states ("states") ("1" or "L0" and "0" or "L1") each corresponding to a respective $V_T$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_T$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use $2^n$ levels of charge to store n bits. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of memory cells.

A valley margin can also be referred to as a read window. For example, in a SLC cell, there is 1 read window that exists with respect to the 2 $V_t$ distributions. As another example, in an MLC cell, there are 3 read windows that exist with respect to the 4 $V_t$ distributions. As yet another example, in a TLC cell, there are 7 read windows that exist with respect to the 8 $V_t$ distributions. Read window size generally decreases as the number of states increases. For example, the 1 read window for the SLC cell may be larger than each of the 3 read windows for the MLC cell, and each of the 3 read windows for the MLC cell may be larger than each of the 7 read windows for the TLC cell, etc. Read window budget (RWB) refers to the cumulative value of the read windows.

A block of a memory device can be characterized based on the programming state of its wordlines. For example, an open block refers to a block in which some of the wordlines are not currently programmed (e.g., in an erase state), and a closed block refers to a block in which all of the wordlines are programmed. A block can also be characterized based on age, which can be defined in view of a number of program/erase (P/E) cycles that have been performed with respect to the block. For example, a cycled block refers to a block that has underwent a number of P/E cycles that exceeds a first threshold number of P/E cycles (e.g., an older block), and a fresh block refers to a block that has underwent a number of P/E cycles less than a second threshold number of P/E cycles (e.g., a newer block).

One phenomenon observed in memory devices is $V_T$ distribution shift, also referred to herein as temporal voltage shift (TVS). For example, with respect to programmed pages of a block, storage charge loss (SCL) can cause $V_T$ distributions of the programmed pages to shift towards lower voltages as charge diminishes over, e.g., time and/or temperature. That is, SCL and the corresponding $V_T$ distribution shift towards lower voltages can be proportional to the elapsed time from a programming operation to a read operation. Conversely, with respect to erased pages (e.g., erased pages of partially programmed blocks), storage charge gain (SCG) can cause $V_T$ distributions of the erased pages to shift towards higher voltage.

A variety of different detection techniques can be used to detect charge loss and/or charge gain. One example of a detection technique that can be used to detect charge loss or charge gain is a block-level detection technique. During a block-level detection technique, a controller can initiate a block-level read. The controller can then obtain a block-level voltage measurement during the block-level read (e.g., a highest voltage level in the block), determine an amount of charge loss from the block-level voltage measurement, and apply a set of appropriate read level offsets to address the charge loss.

One example of a block-level detection technique is dynamic pass-through voltage ($V_{pass}R$). During a read operation of a cell (i.e. a "read cell"), a read reference voltage ($V_{ref}$) can be applied to an associated wordline, and a sense amplifier connected to an associated bitline can be used to sense whether the read cell has been switched on. More specifically, if $V_{ref}$ is higher than a threshold voltage ($V_T$) of the read cell, then the read cell is turned on. It is noted that only one cell per bitline can be read at a time. Since the cells of a bitline are connected in series, all transistors for cells of the bitline that are not being read ("unread cells") need to be kept on during the read operation in order for the read output of the read cell to pass-through to the sense amplifier. To achieve this, $V_{pass}R$ can be applied to the wordlines of the unread cells to keep the unread cells activated (i.e., turned on). The magnitude of $V_{pass}R$ is chosen to be greater than the $V_T$'s of the unread cells, but less than a programming voltage. Although $V_{pass}R$ is a lower voltage than the programming voltage, the application of $V_{pass}R$ can affect (e.g., increase) the $V_T$'s and thus alter logic states of the unread cells of the block via tunneling currents. This phenomenon is referred to as "read disturb." As more read operations are applied within the block, the accumulation of read disturb over time lead to read disturb errors.

During dynamic $V_{pass}R$, all wordlines can be ramped up together and a current (e.g., pillar current) can be measured at a power supply voltage (e.g., $V_{REG2}$) until the current is larger than some threshold current value. The $V_T$ of cells connected to a selected wordline ($WL_{sel}$) can be detected directly. For example, cells connected to the unselected wordlines ($WL_{unsel}$) can be ramped to $V_{pass}R$. Then, the cells connected to $WL_{sel}$ can be ramped down to a lower voltage to detect the $V_T$ of those cells. SCL can then be detected if a lower magnitude wordline voltage is needed to meet the threshold current value.

An open block refers to a block that is open for programming, and can include a combination of programmed pages and/or erased pages. In some instances, an open block can be a homogeneously written block. A homogeneously written block refers to at least a partially written block in which the cells connected to the first wordline of the block and the cells connected to the last wordline of the block have an approximately same amount and/or rate of charge loss. For example, the difference in the amount of time between the programming performed with respect to the first wordline of the block and the programming with respect to the last wordline of the block is sufficiently small. Block-level detection techniques can be performed to detect charge loss on homogeneously written blocks.

In some instances, an open block can be a mixed SCL block. In contrast to a homogeneously written block, a mixed SCL block refers to an open block that exhibits variations in rates of charge loss among programmed wordlines and/or variations in rates of charge gain among erased wordlines (e.g., earlier programmed wordlines can exhibit greater charge loss than more recently programmed wordlines). The variations observed in a mixed SCL block can be due to the open block being open for a sufficiently long amount of time (e.g., greater than 1 hour). Such variations in charge loss and/or charge gain rates can lead to reduced memory device performance. For example, such variations can lead to poor trigger rates, and potential reliability concerns if there is too much charge gain with respect to the erased state $V_T$ distribution (e.g., L0). Therefore, it can be beneficial to abandon a mixed SCL block before the variations in charge loss rates and/or charge gain rates becomes problematic. However, it may not be possible to use a block-level detection technique to detect and address charge loss and/or charge gain with respect to a mixed SCL block. Moreover, other charge loss and/or charge gain detection techniques may negatively affect memory device performance and/or consume a large number of memory resources.

To address a mixed SCL block, a controller can cause the mixed SCL block to be abandoned if an amount of time that has elapsed since writing the first page of the mixed SCL block satisfies a threshold condition. For example, an open block can be abandoned if the amount of time that has elapsed since writing the first page exceeds a threshold amount of time. The threshold amount of time can reflect an amount of time in which an unacceptable variation in charge loss may be observed among the wordlines of the mixed SCL block (e.g., 1 hour). A timer operatively coupled to the controller can measure the amount of time that has elapsed since writing a first page of an open block. However, the timer functionality may be lost when the memory device experiences a power loss event. When this occurs, a worst case scenario may be assumed and the controller can automatically abandon an open block upon restoring power. A number of problems can result from such automatic block abandonment. For example, the automatic block abandonment can lead to write amplification in which the actual amount of information physically written to the memory device is a multiple of the logical amount intended to be written to the memory device. The write amplification can be particularly pronounced when the memory device has a large power cycle specification. Accordingly, automatic block abandonment can negatively impact memory device performance and efficiency.

Aspects of the present disclosure address the above and other deficiencies by providing a memory sub-system that implements program continuation strategies after memory device power loss. Generally, embodiments described herein can determine whether a block that was open prior to a power loss event should remain open for programming upon power being restored to the memory device. Embodiments described herein can be used to determine when it is safe to continue writing to a partially written block.

After power is restored at a memory device, a controller of the memory device can select an open block of the memory device for analysis, and determine whether the open block is valid for programming by analyzing a set of programmed pages (or wordlines) of the open block to obtain a charge loss metric and/or analyzing a set of erased pages of the open block to obtain a charge gain metric. For example, the charge loss metric and the charge gain metric can be amounts of charge loss and charge gain, respectively. As another example, the charge loss metric and the charge gain metric can each be a proxy indicative of an amount of charge loss or charge gain, respectively. The controller can then determine whether the charge loss metric and/or the charge gain metric each satisfy a respective threshold condition indicative of an acceptable amount or rate of charge loss and/or threshold condition indicative of an acceptable amount or rate of charge gain. If the charge loss metric and/or the charge gain metric satisfy their respective charge loss threshold conditions, then the block is considered to be valid for writes and is kept open. Otherwise, the controller causes the block to be abandoned and is closed for writes.

Moreover, an oldest written page and the newest written page can each be assigned a charge loss index value ("index value"). For example, each index value can correlate to an amount of adjustment applied to compensate for the charge loss of its respective page. The controller can further determine whether the open block is valid for programming by analyzing the index values. For example, the controller can obtain an index delta as a difference between the index values of the newest written and then oldest written pages, and determine whether the index delta satisfies an index delta threshold condition. The index delta threshold condition can be a threshold value defining a maximum allowable index delta (e.g., a sufficiently small difference between the index values). If the index delta satisfies the index delta threshold condition (e.g., the index delta is less than or equal to the maximum allowable index delta), then the newest written page can be adjusted to match the charge loss degradation of the most recently written page. Additionally or alternatively, the controller can determine whether both index values satisfy an index value threshold condition. For example, the index value threshold condition can be a threshold value defining a maximum allowable index value. The controller can determine that the open block is valid for programming if both index values satisfy the index value threshold condition (e.g., both index values are less than or equal to the maximum allowable index value). Further details regarding implementing program continuation strategies after memory device power loss will be described herein below with reference to FIGS. 1-3.

The method performed by the memory sub-system described above can be implemented with any suitable memory device architecture in accordance with the embodiments described herein. In one embodiment, the method can be implemented with a memory device implementing replacement gate NAND (RG NAND) technology. A replacement gate (RG) NAND device is a NAND device that implements a RG architecture rather than a floating gate (FG) architecture. The RG NAND architecture removes cell gaps that are typically found in FG NAND architectures, thereby reducing or eliminating capacitance resulting from those cell gaps. More specifically, the RG NAND architecture corresponds to a single-insulator structure. The RG NAND architecture can enable smaller size, improved read and write latency, and increase in transfer rate as compared to the FG NAND architecture.

Advantages of the present disclosure include, but are not limited to, improved memory device performance and reduced memory device resource consumption. For example, implementations described herein can extend the life of an open block as compared to automatic block abandonment methods.

FIG. 1 illustrates an example computing system 100 that includes a memory sub-system 110, in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DEV IM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes a program continuation strategy (PCS) component 113 that can implement program continuation strategies after memory device power loss. Generally, the PCS component 113 can determine whether a block that was open prior to a power loss event is write-worthy upon power being restored to the memory device. For example, the PCS component 113 can determine when it is safe to continue writing to a partially written block.

The PCS component 113, upon detecting a power up event of a memory device, can select an open block of the memory device for analysis. The PCS component 113 can then determine whether the open block is valid for programming by analyzing a set of pages (or wordlines) of an open block of the memory device.

Determining whether the open block is valid for programming can include analyzing a set of programmed pages of the open block to obtain a charge loss metric. For example, the set of programmed pages can include the oldest written page of the block. As another example, the set of programmed pages can include a set of sample programmed pages. To obtain the charge loss metric, the PCS component 113 can cause the set of programmed pages to be read with a wordline-level detection technique. To perform a wordline-level detection technique for detecting charge loss with respect to a programmed page of the set of programmed pages (e.g., the oldest written page, or a sample page of the set of sample pages), the PCS component 113 can set a charge loss detection read level at a position in the valley or read window to the left of the right-most programmed state $V_T$ distribution (e.g., L7 for TLC cell implementations, L15 in QLC cell implementations). The charge loss detection read level can remain static throughout all charge loss detections. The PCS component 113 can then perform a read at the charge loss detection read level to determine the charge loss metric. The PCS component 113 can then determine whether the charge loss metric satisfies a charge loss threshold condition. If the charge loss metric satisfies the charge loss threshold condition, then the block is considered to be valid for writes and the PCS component 113 keeps the block open. Otherwise, the PCS component 113 causes the block to be abandoned.

In some embodiments, the charge loss metric is an amount of charge loss. For example, the amount of charge loss can be an amount of charge loss with respect to the oldest written page of the block. As another example, the amount of charge loss can be a function of individual charge loss metrics obtained from each sample programmed page of the set of sample programmed pages (e.g., the amount of charge loss can be an average of the individual charge loss metrics). The PCS component 113 can determine whether the charge loss metric satisfies the charge loss threshold condition by determining whether the amount of charge loss is less than or equal to a threshold amount of charge loss.

The charge loss metric can alternatively be a proxy indicative of an amount of charge loss. In some embodiments, the charge loss metric is a number of cells that have a $V_T$ above the charge loss detection read level (e.g., a bit count). For example, the charge loss metric can be the number of cells that have a $V_T$ above the charge loss detection read level with respect to the oldest written page of the block. As another example, the charge loss metric can be a function of individual numbers of cells that have a $V_T$ above the charge loss detection read level obtained from each sample programmed page of the set of sample programmed pages (e.g., the number of cells that have a $V_T$ above the charge loss detection read level can be an average of the individual numbers of cells that have a $V_T$ above the charge loss detection read level).

If the charge loss metric is a number of cells that have a $V_T$ above the charge loss detection read level, then the PCS component 113 can determine whether the number of cells that have a $V_T$ above the charge loss detection read level satisfies the charge loss threshold condition by determining whether the number of cells that have a $V_T$ above the charge loss detection read level is greater than or equal to a threshold number of cells. Since the charge loss detection read level remains static and the right-most programmed state $V_T$ distributions gradually shift to the left over time, the number of cells that have a $V_T$ above the charge loss detection read level will gradually decrease as a function of the shift. Eventually, the number of cells that have a $V_T$ above the charge loss detection read level will fall below the threshold number of cells, which indicates that the amount of charge loss exceeds a threshold amount of charge loss.

In some embodiments, the charge loss metric is a position difference related to movement of the center of the valley to the left of the right-most programmed state $V_T$ distribution. For example, the position of the center of the valley at the time of measurement can be compared to the position of the center of the valley at the time of manufacturing to obtain the position difference. For example, the charge loss metric can be the positional difference with respect to the oldest written page of the block. As another example, the charge loss metric can be a function of individual position differences obtained from each sample programmed page of the set of sample programmed pages (e.g., an average position difference). The PCS component 113 can then determine whether the charge loss metric satisfies the charge loss threshold condition by determining whether the position difference is greater than or equal to a threshold position difference (e.g., greater than 200 mV).

Obtaining the position difference can include, for example, locating the center of the valley using a multi-strobe read. A multi-strobe read performs a number of read strobes at a number of read level offsets. The outputs of the read strobes at each read level offset can be used to determine or approximate the position of the center of the valley, which can be used to obtain the position difference.

In some embodiments, the multi-strobe read is a two-strobe read. During a two-strobe read, a negative read level offset and a positive read level offset can be defined with respect to a calibrated read level. The PCS component 113 can cause a strobe read to be performed using the negative read level offset to detect the shift of the left edge of the valley. The PCS component 113 can further cause a strobe read to be performed using the positive read level offset to detect the shift of the right edge of the valley. Accordingly, the outputs from the two-strobe read can then be used to identify the current center of the valley.

In some embodiments, the multi-strobe read is a three-strobe read. During a three-strobe read, a left read level offset, a right read level offset and a center read level offset can be defined. For example, the center read level may be equidistant from the negative read level offset and the positive read level offset. However, the center read level could be located closer to one of the negative read level offset or the positive read level offset. The PCS component 113 can further cause respective strobe reads to be performed using the negative read level offset, the positive read level offset, and the center read level offset. Accordingly, the outputs from the three-strobe read can then be used to identify the current center of the valley.

Additionally or alternatively, determining whether the open block is valid for programming can include analyzing a set of erased pages of the open block to obtain a charge gain metric. For example, the set of erased pages can include a first erased page of the block where programming shall resume. As another example, the set of erased pages can include a set of sample erased pages. To obtain the charge gain metric, the PCS component 113 can cause the set of erased pages to be read with a wordline-level detection technique. To perform a wordline-level detection technique with respect to an erased page of the set of erased pages (e.g., the first erased page, or a sample page of the set of sample pages), the PCS component 113 can set a charge gain detection read level at a position in the valley or read window to the right of the erased state $V_T$ distribution (e.g., L0 for QLC and TLC cell implementations). The charge gain detection read level can remain static throughout all charge gain detections. The PCS component 113 can then perform a read at the charge gain detection read level to determine the charge gain metric. The PCS component 113 can then determine whether the charge gain metric satisfies a charge gain threshold condition. If the charge gain metric satisfies the charge gain threshold condition, then the block is considered to be valid for writes and the PCS component 113 keeps the block open. Otherwise, the PCS component 113 causes the block to be abandoned.

In some embodiments, the charge gain metric is an amount of charge gain. For example, the amount of charge gain can be an amount of charge gain with respect to the first erased page of the block. As another example, the amount of charge gain can be a function of individual charge gain metrics obtained from each sample erased page of the set of sample erased pages (e.g., the amount of charge gain can be an average of the individual charge gain metrics). The PCS component 113 can determine whether the charge loss metric satisfies the charge gain threshold condition by determining whether the amount of charge gain is less than or equal to a threshold amount of charge gain.

The charge gain metric can alternatively be a proxy indicative of an amount of charge gain. In some embodiments, the charge gain metric is a number of cells that have a $V_T$ above the charge gain detection read level. For example, the charge gain metric can be the number of cells that have a $V_T$ above the charge gain detection read level with respect to the first erased page of the block. As another example, the number of cells that have a $V_T$ above the charge gain detection read level can be a function of individual numbers of cells that have a $V_T$ above the charge gain detection read level obtained from each sample erased page of the set of sample erased pages (e.g., the number of cells that have a $V_T$ above the charge gain detection read level can be an average of the individual numbers of cells that have a $V_T$ above the charge gain detection read level).

If the charge gain metric is a number of cells that have a $V_T$ above the charge gain detection read level, then the PCS component 113 can determine whether the number of cells that have a $V_T$ above the charge gain detection read level satisfies the charge gain threshold condition by determining whether the number of cells that have a $V_T$ above the charge gain detection read level is less than or equal to a threshold number of cells. Since the charge gain detection read level remains static and the erased state $V_T$ distributions gradually shift to the right over time, the number of cells that have a $V_T$ above the charge gain detection read level will gradually increase as a function of the shift. Eventually, the number of cells that have a $V_T$ above the charge gain detection read level will fall above the threshold number of cells, which indicates that the amount of charge gain exceeds a threshold amount of charge gain.

In some embodiments, the charge gain metric is a position difference related to movement of the center of the valley to the right of the erased state $V_T$ distribution. For example, the position of the center of the valley at the time of measurement can be compared to the position of the center of the valley at the time of manufacturing to obtain the position difference. For example, the charge loss metric can be the positional difference with respect to the first erased page of the block. As another example, the charge loss metric can be a function of individual position differences obtained from each sample erased page of the set of sample erased pages (e.g., an average position difference). The PCS component 113 can then determine whether the charge gain metric satisfies the charge gain threshold condition by determining whether the position difference is greater than or equal to the threshold position difference (e.g., greater than 200 mV). The position difference can be obtained in a similar manner as described above with respect to the charge loss metric (e.g., multi-strobe read).

The PCS component 113 can obtain at least one of the charge loss metric or the charge gain metric in order to determine whether the open block is valid for programming after powering up. For example, the PCS component 113 can determine whether the open block is valid for programming using at least one of the charge loss metric or the charge gain metric. As another example, the PCS component 113 can obtain the charge gain metric in response to determining that the charge loss metric fails to satisfy the charge loss threshold condition. As yet another example, the PCS component 113 can obtain the charge loss metric in response to determining that the charge gain metric satisfies the charge gain threshold condition.

Moreover, an oldest written page and the newest written page can each be assigned a charge loss index value ("index value"). For example, each index value can correlate to an amount of adjustment applied to compensate for the charge loss of its respective page. The PCS component 113 can further determine whether the open block is valid for programming by analyzing the index values. For example, the PCS component 113 can obtain an index delta as a difference between the index values of the newest written and then oldest written pages, and determine whether the index delta satisfies an index delta threshold condition. The index delta threshold condition can be a threshold value defining a maximum allowable index delta (e.g., a sufficiently small difference between the index values). If the index delta satisfies the index delta threshold condition (e.g., the index delta is less than or equal to the maximum allowable index delta), then the newest written page can be adjusted to match the charge loss degradation of the most recently written page. Additionally or alternatively, the PCS component 113 can determine whether both index values satisfy an index value threshold criterion (e.g., both index values are less than or equal to a maximum allowable index value). The PCS component 113 can determine that the open block is valid for programming both index values are less than or equal to the maximum allowable index value.

In some embodiments, the memory sub-system controller 115 includes at least a portion of the PV component 113. In some embodiments, the PCS component 113 is part of the host system 110, an application, or an operating system. In other embodiments, local media controller 135 includes at least a portion of PCS component 113 and is configured to perform the functionality described herein. Further details regarding the operation of the PCS component 113 are described below with reference to FIGS. 2-3.

Figure 2:
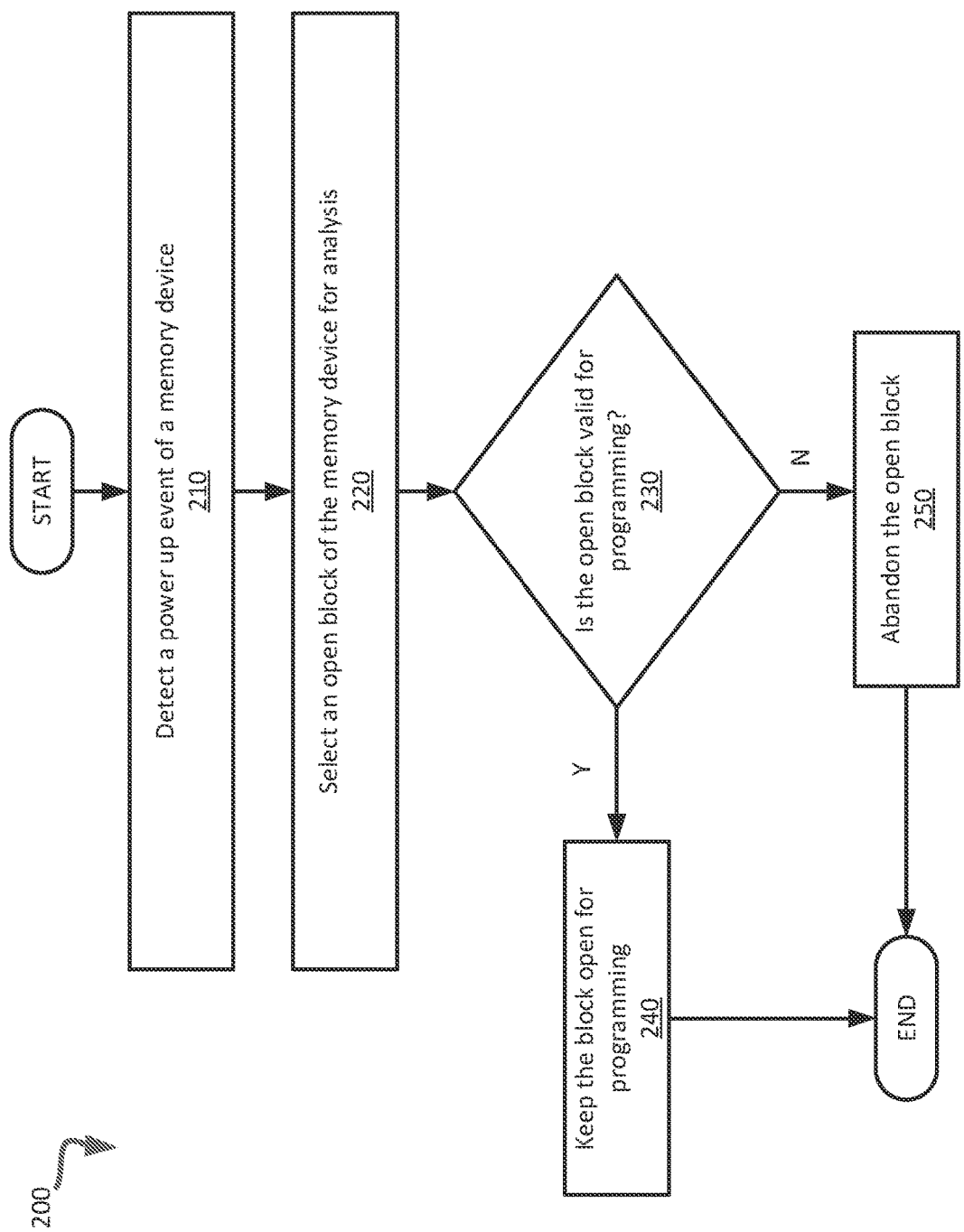
FIG. 2 is a flow diagram of an example method for implementing program continuation strategies after memory device power loss, in accordance with some embodiments of the present disclosure.

FIG. 2 is a flow diagram of an example method 200 for implementing a program continuation strategy to detect short power loss, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the PCS component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic detects a power up event of a memory device. For example, the power up event can occur after the memory device experienced a power loss event.

At operation 220, the processing logic selects an open block of the memory device for analysis. The open block can include a number of pages each corresponding to a respective wordline. The pages can include one or more programmed pages and/or one or more erased pages. For example, the open block can be a partially programmed block including at least one erased page. An illustrative example of an open block is provided below with reference to FIG. 3.

At operation 230, the processing logic determines whether the open block is valid for programming. In other words, the determination is made in order to decide whether to continue keeping the open block for writes or to abandon or close the open block. Determining whether the open block is valid for programming can include analyzing a set of programmed pages of the open block to obtain a charge loss metric and determining whether the charge loss metric satisfies a charge loss threshold condition. For example, the set of programmed pages can include the oldest written page of the block. As another example, the set of programmed pages can include a set of sample programmed pages. To obtain the charge loss metric, the PCS component 113 can cause the set of programmed pages to be read with a wordline-level detection technique.

In some embodiments, the charge loss metric is an amount of charge loss. For example, the amount of charge loss can be an amount of charge loss with respect to the oldest written page of the block. As another example, the amount of charge loss can be a function of individual charge loss metrics obtained from each sample programmed page of the set of sample programmed pages (e.g., the amount of charge loss can be an average of the individual charge loss metrics). Determining whether the charge loss metric satisfies the charge loss threshold condition can include determining whether the amount of charge loss is less than or equal to a threshold amount of charge loss.

The charge loss metric can alternatively be a proxy indicative of an amount of charge loss. In some embodiments, the charge loss metric is a number of cells that have a $V_T$ above the charge loss detection read level (e.g., bit count). For example, the charge loss metric can be the number of cells that have a $V_T$ above the charge loss detection read level with respect to the oldest written page of the block. As another example, the number of cells that have a $V_T$ above the charge loss detection read level can be a function of individual numbers of cells that have a $V_T$ above the charge loss detection read level obtained from each sample programmed page of the set of sample programmed pages (e.g., the number of cells that have a $V_T$ above the charge loss detection read level can be an average of the individual numbers of cells that have a $V_T$ above the charge loss detection read level). Determining whether the number of cells that have a $V_T$ above the charge loss detection read level satisfies the charge loss threshold condition can include determining whether the number of cells that have a $V_T$ above the charge loss detection read level is greater than or equal to a threshold number of cells. Since the charge loss detection read level remains static and the right-most programmed state $V_T$ distributions gradually shift to the left over time, the number of cells that have a $V_T$ above the charge loss detection read level will gradually decrease as a function of the shift. Eventually, the number of cells that have a $V_T$ above the charge loss detection read level will fall below the threshold number of cells, which indicates that the amount of charge loss exceeds a threshold amount of charge loss.

In some embodiments, the charge loss metric is a position difference related to movement of the center of the valley to the left of the right-most programmed state $V_T$ distribution. For example, the position of the center of the valley at the time of measurement can be compared to the position of the center of the valley at the time of manufacturing to obtain the position difference. For example, the charge loss metric can be the positional difference with respect to the oldest written page of the block. As another example, the charge loss metric can be a function of individual position differences obtained from each sample programmed page of the set of sample programmed pages (e.g., an average position difference). The PCS component 113 can then determine whether the charge loss metric satisfies the charge loss threshold condition by determining whether the position difference is greater than or equal to a threshold position difference (e.g., greater than 200 mV). Further details regarding obtaining the charge loss metric are described above with respective to FIG. 1.

Additionally or alternatively, determining whether the open block is valid for programming can include analyzing a set of erased pages of the open block to obtain a charge gain metric. For example, the set of erased pages can include a first erased page of the block where programming shall resume. As another example, the set of erased pages can include a set of sample erased pages. To obtain the charge gain metric, the PCS component 113 can cause the set of erased pages to be read with a wordline-level detection technique.

In some embodiments, the charge gain metric is an amount of charge gain. For example, the amount of charge gain can be an amount of charge gain with respect to the first erased page of the block. As another example, the amount of charge gain can be a function of individual charge gain metrics obtained from each sample erased page of the set of sample erased pages (e.g., the amount of charge gain can be an average of the individual charge gain metrics). Determining whether the charge gain metric satisfies the charge gain threshold condition can include determining whether the amount of charge gain is less than or equal to a threshold amount of charge loss.

The charge gain metric can alternatively be a proxy indicative of an amount of charge gain. In some embodiments, the charge gain metric is a number of cells that have a $V_T$ above the charge gain detection read level (e.g., bit count). For example, the charge gain metric can be the number of cells that have a $V_T$ above the charge gain detection read level with respect to the first erased page of the block. As another example, the number of cells that have a $V_T$ above the charge gain detection read level can be a function of individual numbers of cells that have a $V_T$ above the charge gain detection read level obtained from each sample erased page of the set of sample erased pages (e.g., the number of cells that have a $V_T$ above the charge gain detection read level can be an average of the individual numbers of cells that have a $V_T$ above the charge gain detection read level). Determining whether the number of cells that have a $V_T$ above the charge gain detection read level satisfies the charge gain threshold condition can include determining whether the number of cells that have a $V_T$ above the charge gain detection read level is less than or equal to a threshold number of cells. Since the charge gain detection read level remains static and the erased state $V_T$ distributions gradually shift to the right over time, the number of cells that have a $V_T$ above the charge gain detection read level will gradually increase as a function of the shift. Eventually, the number of cells that have a $V_T$ above the charge gain detection read level will fall above the threshold number of cells, which indicates that the amount of charge gain exceeds a threshold amount of charge gain.

In some embodiments, the charge gain metric is a position difference related to movement of the center of the valley to the right of the erased state $V_T$ distribution. For example, the position of the center of the valley at the time of measurement can be compared to the position of the center of the valley at the time of manufacturing to obtain the position difference. For example, the charge loss metric can be the positional difference with respect to the first erased page of the block. As another example, the charge loss metric can be a function of individual position differences obtained from each sample erased page of the set of sample erased pages (e.g., an average position difference). The PCS component 113 can then determine whether the charge gain metric satisfies the charge gain threshold condition by determining whether the position difference is greater than or equal to the threshold position difference (e.g., greater than 200 mV). The position difference can be obtained in a similar manner as described above with respect to the charge loss metric (e.g., multi-strobe read). Further details regarding obtaining the charge gain metric are described above with respective to FIG. 1.

At least one of the charge loss metric or the charge gain metric can be obtained in order to determine whether the open block is valid for programming after powering up at operation 230. For example, the processing logic can determine whether the open block is valid for programming using at least one of the charge loss metric or the charge gain metric. As another example, the processing logic can obtain the charge gain metric in response to determining that the charge loss metric fails to satisfy the charge loss threshold condition. As yet another example, the processing logic can obtain the charge loss metric in response to determining that the charge gain metric satisfies the charge gain threshold condition. Further details regarding obtaining the charge loss metric and the charge gain metric will be described below with reference to FIG. 4.

In some embodiments, the processing logic can further determine whether the open block is valid for programming by analyzing charge loss index values ("index values") of an oldest written page and a newest written page of the open block. For example, the processing logic can determine whether an index delta obtained as a difference between the index values satisfies index delta threshold condition (e.g., the index delta is less than or equal to a maximum allowable index delta. Additionally or alternatively, the processing logic can determine whether both index values satisfy an index value threshold condition (e.g., both index values are less than or equal to a maximum allowable index value). Further details regarding analyzing the index values are described above with reference to FIG. 1

If the open block is determined to be valid for programming at operation 230 (e.g., the charge loss metric and/or the charge gain metric satisfy their respective threshold conditions), then the processing logic keeps the open block open for programming at operation 240. Otherwise, if the open block is determined to be invalid for further programming (e.g., the charge loss metric and/or the charge gain metric satisfy their respective threshold conditions), the processing logic at operation 250 abandons the open block. After the open block is kept open at operation 240 or abandoned at operation 250, the processing logic can revert back to operation 220 to select another open block of the memory device for analysis.

Figure 3:
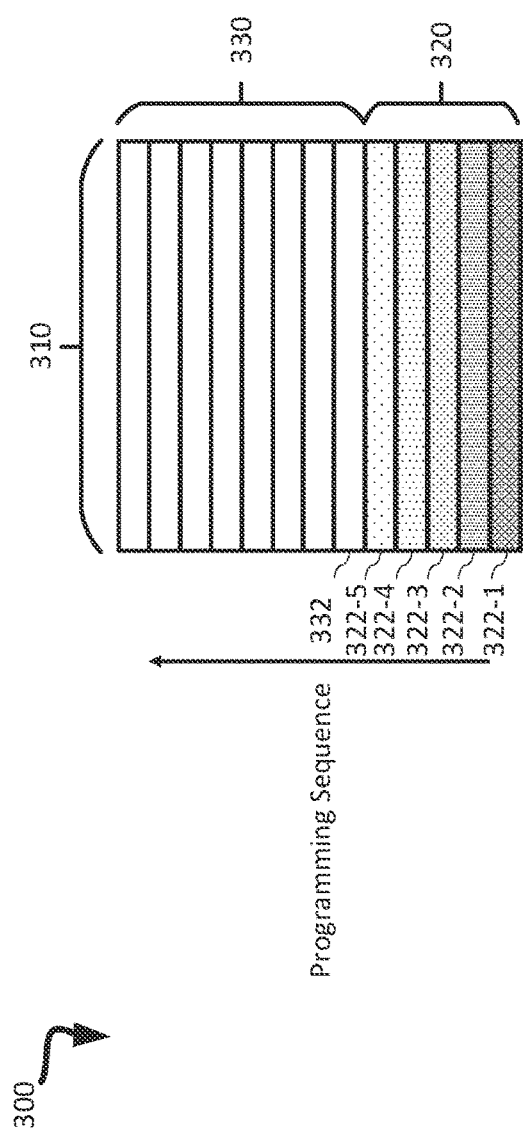
FIG. 3 is a diagram illustrating an example open block of a memory device, in accordance with some embodiments of the present disclosure.

FIG. 3 illustrates a diagram 300 illustrating an example open block 310, in accordance with some embodiments of the present disclosure. For example, the open block 310 can be a NAND block. As shown, the block 310 includes a set of programmed pages 320 and a set of erased pages 330. The set of programmed pages 320 includes programmed pages 322-1 through 322-5, where programmed page 322-1 corresponds to the oldest programmed page having the oldest programmed data, and programmed page 322-5 corresponds to the most recent programmed page having the newest programmed data. The set of erased pages 330 includes an erased page 332. The programming sequence goes upwards from the oldest programmed data (e.g., from page 322-1). As described in further detail above with reference to FIG. 2, after powering up the memory device, it can be determined whether the open block is valid for programming.

Figure 4:
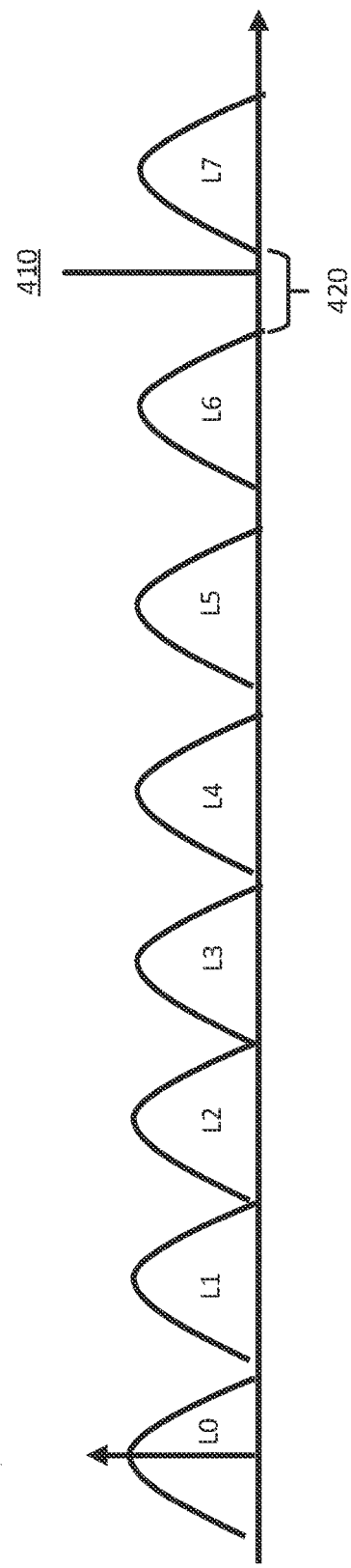
FIG. 4 is a diagram illustrating an example implementation of charge loss detection that can be performed after memory device power loss, in accordance with some embodiments of the present disclosure.

FIG. 4 is a diagram 400 illustrating an example implementation of charge loss detection that can be performed after memory device power loss, in accordance with some embodiments of the present disclosure. For example, the charge loss detection can be performed using a wordline-level detection technique. In some embodiments, the wordline-level detection technique is digital CFBYTE.

The diagram 400 illustrates a number of threshold distributions "L0" through "L7" of a TLC cell. Although TLC cell distributions are shown, the charge loss detection technique described herein can be performed with respect to any suitable type of cell in accordance with embodiments described herein (e.g., SLC, MLC, QLC, PLC). The diagram 400 further illustrates at least one charge loss detection read level 410. The charge loss detection read level 410 is placed somewhere in a valley 420 between the "L6" distribution and the "L7" distribution. The charge loss detection read level 410 can remain static throughout all charge loss detections. A controller of the memory device can perform a read at the charge loss detection read level 410 to determine a charge loss metric.

For example, the charge loss metric can be an amount of charge loss, as described in further detail above with reference to FIGS. 1-2. As another example, the charge loss metric can be a number of cells that have a $V_T$ above the charge loss detection read level (e.g., bit count), as described in further detail above with reference to FIGS. 1-2. As yet another example, the charge loss metric can be a position difference related to movement of the center of the valley to the right of the erased state $V_T$ distribution, as described in further detail above with reference to FIGS. 1-2. In this example, although only one charge loss detection read level 410 is shown, multiple charge loss detection read levels (e.g., read level offsets) can be used to obtain the position difference (e.g., multi-strobe read). It can then be determined whether the charge loss metric satisfies a charge loss threshold condition, as described in further detail above with reference to FIGS. 1-2. Additionally or alternatively, a similar process can be used to detect charge gain by placing at least one charge gain detection read level to the right of an "L0" distribution of an erased page (not shown), as described in further detail above with reference to FIGS. 1-2.

Figure 5:
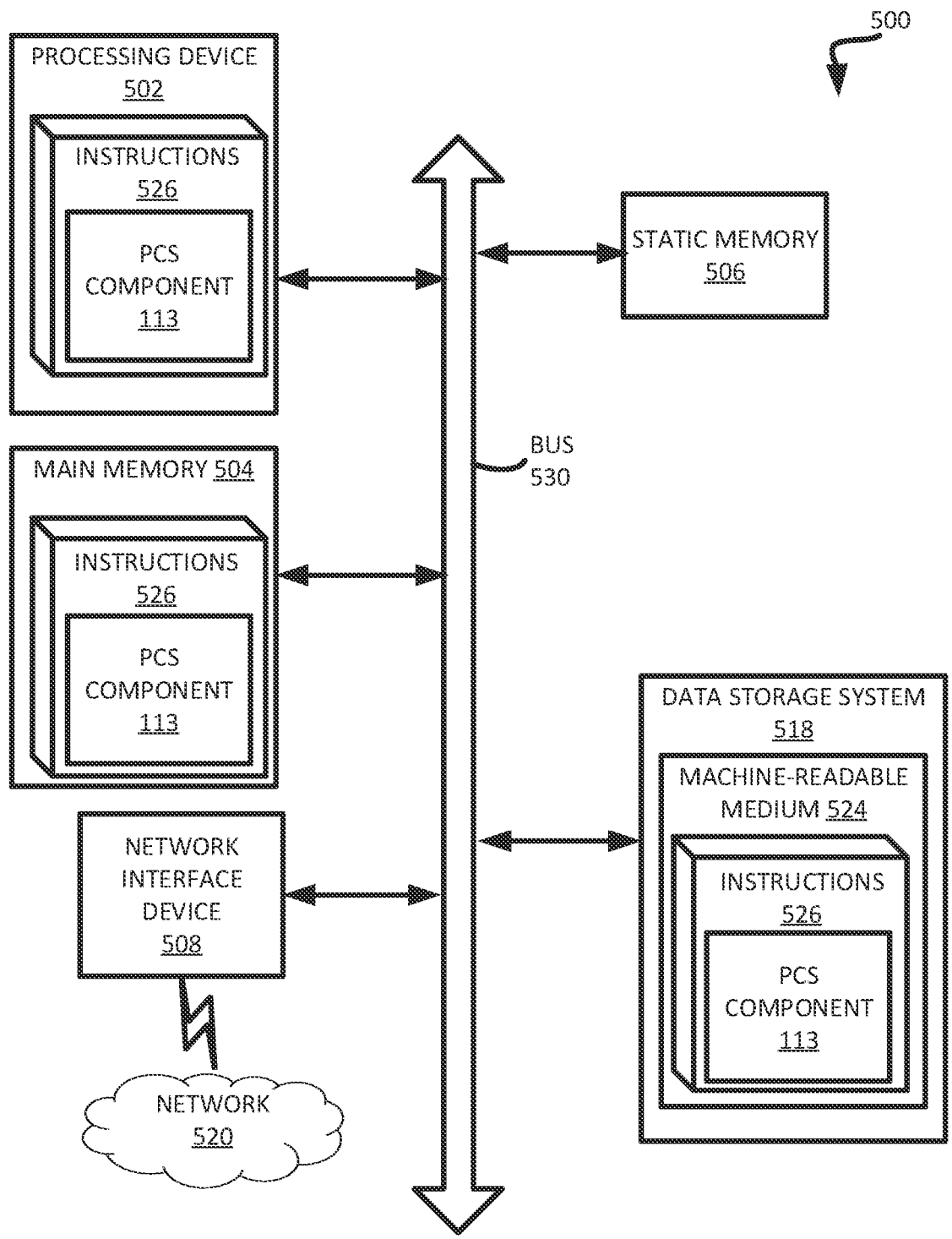
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the PCS component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or RDRAM, etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a PCS component (e.g., the PCS component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
   detecting a power up event of the memory device;
   responsive to detecting the power up event, selecting an open block of the memory device, wherein the open block comprises a set of pages;
   analyzing the set of pages to obtain at least one of:
      at least one charge loss metric indicative of charge loss associated with a set of programmed pages of the set of pages, the set of programmed pages comprising at least one of: an oldest written page of the open block, or at least one first sample page associated with at least one respective individual charge loss metric; or
      at least one charge gain metric indicative of charge gain associated with a set of erased pages of the set of pages, the set of erased pages comprising at least one of: an initial erased page of the open block, or at least one second sample page associated with at least one respective individual charge gain metric;
   determining, based on at least one of the at least one charge loss metric or the at least one charge gain metric, whether the open block is valid for programming; and
   responsive to determining that the open block is valid for programming, keeping the open block open for programming.

2. The system of claim 1, wherein determining whether the open block is valid for programming further comprises:
determining whether the at least one charge loss metric satisfies at least one charge loss threshold condition.

3. The system of claim 2, wherein determining whether the at least one charge loss metric satisfies the at least one charge loss threshold condition comprises at least one of:
determining whether an amount of charge loss is less than or equal to a threshold amount of charge loss;
determining whether a number of cells that have a threshold voltage above a charge loss detection read level is greater than or equal to a threshold number of cells; or
determining whether a position difference related to movement of a center of a valley of an erased state threshold voltage distribution is greater than or equal to a threshold position difference.

4. The system of claim 1, wherein the at least one charge loss metric is a function of each respective individual charge loss metric.

5. The system of claim 1, wherein determining whether the open block is valid for programming further comprises:
determining whether the at least one charge gain metric satisfies at least one charge gain threshold condition.

6. The system of claim 5, wherein determining whether the at least one charge gain metric satisfies the at least one charge gain threshold condition comprises at least one of:
determining whether an amount of charge gain is less than or equal to a threshold amount of charge gain;
determining whether a number of cells that have a threshold voltage below a charge gain detection read level is less than or equal to a threshold number of cells; or
determining whether a position difference related to movement of a center of a valley of an erased state threshold voltage distribution is greater than or equal to a threshold position difference.

7. The system of claim 1, wherein the at least one charge gain metric is a function of each respective individual charge gain metric.

8. A method comprising:
detecting, by a processing device, a power up event of a memory device;
responsive to detecting the power up event, selecting, by the processing device, an open block of the memory device, wherein the open block comprises a set of pages;
analyzing, by the processing device, the set of pages to obtain at least one of:
at least one charge loss metric indicative of charge loss associated with a set of programmed pages of the set of pages, the set of programmed pages comprising at least one of: an oldest written page of the open block, or at least one first sample page associated with at least one respective individual charge loss metric; or
at least one charge gain metric indicative of charge gain associated with a set of erased pages of the set of pages, the set of erased pages comprising at least one of: an initial erased page of the open block, or at least one second sample page associated with at least one respective individual charge gain metric;
determining, by the processing device based on at least one of the at least one charge loss metric or the at least one charge gain metric, whether the open block is valid for programming; and
responsive to determining that the open block is invalid for programming, abandoning, by the processing device, the open block.

9. The method of claim 8, wherein determining whether the open block is valid for programming further comprises:
determining whether the at least one charge loss metric satisfies at least one charge loss threshold condition.

10. The method of claim 9, wherein determining whether the at least one charge loss metric satisfies the at least one charge loss threshold condition comprises at least one of:
determining whether an amount of charge loss is less than or equal to a threshold amount of charge loss;
determining whether a number of cells that have a threshold voltage above a charge loss detection read level is greater than or equal to a threshold number of cells; or
determining whether a position difference related to movement of a center of a valley of an erased state threshold voltage distribution is greater than or equal to a threshold position difference.

11. The method of claim 8, wherein the at least one charge loss metric is a function of each respective individual charge loss metric.

12. The method of claim 8, wherein determining whether the open block is valid for programming further comprises:
determining whether the at least one charge gain metric satisfies at least one charge gain threshold condition.

13. The method of claim 12, wherein determining whether the at least one charge gain metric satisfies the at least one charge gain threshold condition comprises at least one of:
determining whether an amount of charge gain is less than or equal to a threshold amount of charge gain;
determining whether a number of cells that have a threshold voltage below a charge gain detection read level is less than or equal to a threshold number of cells; or
determining whether a position difference related to movement of a center of a valley of an erased state threshold voltage distribution is greater than or equal to a threshold position difference.

14. The method of claim 8, wherein the charge gain metric is a function of each respective individual charge gain metric.

15. A non-transitory computer-readable storage medium comprising instructions that, when executed by a processing device, cause the processing device to perform operations comprising:
detecting a power up event of a memory device;
responsive to detecting the power up event, selecting an open block of the memory device, wherein the open block comprises a set of pages, and wherein the set of pages comprises at least one of:
a set of programmed pages comprising at least one of: an oldest written page of the open block, or at least one first sample page associated with at least one respective individual charge loss metric; or
a set of erased pages comprising at least one of: an initial erased page of the open block, or at least one second sample page associated with at least one respective individual charge gain metric;
analyzing the set of pages to obtain at least one of: at least one charge loss metric indicative of charge loss associated with the set of programmed pages or at least one charge gain metric indicative of charge gain associated with the set of erased pages;
determining, based on at least one of the at least one charge loss metric or the at least one charge gain metric, whether the open block is valid for programming; and
responsive to determining that the open block is valid for programming, keeping the open block open for programming.

16. The non-transitory computer-readable storage medium of claim 15, wherein:
 the at least one charge loss metric is a function of each respective individual charge loss metric; and
 the at least one charge gain metric is a function of each respective individual charge gain metric.

17. The non-transitory computer-readable storage medium of claim 15, wherein determining whether the open block is valid for programming further comprises determining whether the at least one charge loss metric satisfies at least one charge loss threshold condition.

18. The non-transitory computer-readable storage medium of claim 17, wherein determining whether the charge loss metric satisfies the charge loss threshold condition comprises at least one of:
 determining whether an amount of charge loss is less than or equal to a threshold amount of charge loss;
 determining whether a number of cells that have a threshold voltage above a charge loss detection read level is greater than or equal to a threshold number of cells; or
 determining whether a position difference related to movement of a center of a valley of an erased state threshold voltage distribution is greater than or equal to a threshold position difference.

19. The non-transitory computer-readable storage medium of claim 15, wherein determining whether the open block is valid for programming further comprises determining whether the at least one charge gain metric satisfies at least one charge gain threshold condition.

20. The non-transitory computer-readable storage medium of claim 19, wherein determining whether the charge gain metric satisfies the charge gain threshold condition comprises at least one of:
 determining whether an amount of charge gain is less than or equal to a threshold amount of charge gain;
 determining whether a number of cells that have a threshold voltage below a charge gain detection read level is less than or equal to a threshold number of cells; or
 determining whether a position difference related to movement of a center of a valley of an erased state threshold voltage distribution is greater than or equal to a threshold position difference.

\* \* \* \* \*